United States Patent [19]
Tannaka et al.

[11] Patent Number: 5,415,172
[45] Date of Patent: May 16, 1995

[54] APPARATUS FOR GENERATING A TRIGGER SIGNAL USED TO TRANSMIT AN ULTRASONIC WAVE

[75] Inventors: Yoshinao Tannaka, Kanagawa; Yoshinobu Watanabe; Yasuhiro Nakamura, both of Yokohama, all of Japan

[73] Assignee: Matsushita Electric Industrial Co., Ltd., Osaka, Japan

[21] Appl. No.: 157,292

[22] Filed: Nov. 26, 1993

[30] Foreign Application Priority Data

Dec. 3, 1992 [JP] Japan ................... 4-349996

[51] Int. Cl.⁶ .............................................. A61B 8/00
[52] U.S. Cl. ............................................. 128/660.01
[58] Field of Search ............... 128/660.07, 661.09, 128/661.04; 307/590, 595, 606; 328/155, 74; 368/120; 377/27

[56] References Cited

U.S. PATENT DOCUMENTS

| | | | |
|---|---|---|---|
| 4,101,761 | 7/1978 | Merryman | 235/92 CA |
| 4,154,113 | 5/1979 | Engeler | 128/661.01 X |
| 5,115,416 | 5/1992 | Gehlbach et al. | 367/138 |

FOREIGN PATENT DOCUMENTS

3440853 5/1985 Germany .

OTHER PUBLICATIONS

"Transmitting Pulse Control Device for UTS Diagnostic Device"—Abstract translation, Publ. No. JP2164349 of Yoshikawa et al. published 25-06-90.

*Primary Examiner*—Francis Jaworski
*Attorney, Agent, or Firm*—Stevens, Davis, Miller & Mosher

[57] ABSTRACT

An apparatus for generating a trigger pulse signal to be used for transmitting an ultrasonic wave includes a reference signal generator for generating a reference signal as a reference to the generation of the trigger pulse signal, a pulse generator for generating the trigger pulse signal after the elapse of a delay time from the reference signal, and a delay time control circuit for controlling the delay time. The delay time control circuit includes a multi-phase clock generator for generating a plurality of clock signals of different phases from each other, a clock selector for selecting one or more of the clock signals, and a pulse generation start circuit for supplying a signal to start the generation of the trigger pulse signal by the pulse generator in accordance with a count derived by counting one of the clock signals selected by the clock selector.

17 Claims, 5 Drawing Sheets

APPARATUS FOR GENERATING A TRIGGER SIGNAL USED TO TRANSMIT AN ULTRASONIC WAVE

BACKGROUND OF THE INVENTION

1. Field of the Invention

The present invention relates to an apparatus for generating a trigger pulse (a so-called delayed pulse generator) used to transmit an ultrasonic wave in ultrasonic diagnosis equipment or ultrasonic doppler blood flow measurement equipment.

2. Description of the Related Art

In ultrasonic diagnose or ultrasonic doppler blood flow measurement equipment, offset trigger signals are applied to a plurality of ultrasonic transducing elements of an ultrasonic transducer to trigger them in order to focus or deflect an ultrasonic transmission beam.

In order to generate the offset trigger pulses and apply them to the ultrasonic transducer, the prior art ultrasonic diagnosis equipment comprises, as shown in FIG. 5, a start of transmission reference signal generator 31 for sending a reference pulse signal a to start the transmission, a delay line circuit 32 for converting the reference pulse signal a to a number of transmission start signals $b_1, b_2, b_3, \ldots, b_n$ which are delayed from each other by a predetermined time, a pulse oscillation circuit 33 for converting the transmission start pulse signals to trigger pulse signals $c_1, c_2, c_3, \ldots, c_n$ having desired frequencies and numbers of waves, and a transducer drive circuit 34 for converting the trigger pulse signals $c_1, c_2, c_3, \ldots, c_n$ to high voltage transmission pulse signals $d_1, d_2, d_3, \ldots, d_n$. The transmission pulse signals produced by the transducer drive circuit 34 are supplied to a transducer 35 which sends ultrasonic pulses $e_1, e_2, e_3, \ldots, e_n$ to a human body.

The pulse oscillation circuit 33 has n RC burst oscillation circuits which produce the trigger pulse signals $c_1, c_2, c_3, \ldots, c_n$ by oscillation. The oscillation frequencies of the respective oscillation circuits (the pulse frequencies of the trigger pulse signals) are determined by resistors and capacitors of the oscillation circuits. It is therefore necessary to select the values of the resistors and the capacitors so that the oscillation frequencies meet the desired values.

Waveforms of the pulse signals produced in the apparatus are shown in FIG. 6. The delays in the respective trigger pulse signals which are required for focusing and deflecting the transmission ultrasonic beams are introduced in the conversion by the delay line circuit 32.

SUMMARY OF THE INVENTION

In the prior art apparatus shown in FIGS. 5 and 6, since all of the delay times for the respective trigger pulse signals are derived by the delay line of the delay line circuit 32, a delay line having a large delay time should be adopted. However, it is difficult to enhance a precision of the delay line having a large delay time. As a result, it is difficult to improve the precision of the delay time of the trigger pulse signals. Further, the adoption of the delay line having the large delay time means the increase of the amount of delay lines used and high frequency characteristics are required by the increase. This will lead to increase of the cost of the trigger pulse generator and increase of the circuit scale.

Further, in the pulse oscillator 33 of the prior art apparatus, it is necessary to provide as many oscillators as the number n of pulses to be transmitted, and the circuit scale increases as the number n of pulses increases. Since the oscillators primarily comprise resistors and capacitors, compactness is not attained and the precision of the oscillation frequencies is degraded by the instability factors of constants inherent to the resistors and the capacitors.

It is an object of the present invention to provide a trigger pulse generator which solves the problems encountered in the prior art apparatus and which is of high precision, compact and inexpensive to manufacture.

In order to achieve the above object, in accordance with one aspect of the present invention, the apparatus for generating a trigger pulse signal to be used for transmitting an ultrasonic wave comprises a reference signal generator for generating a reference signal as a reference to the generation of the trigger pulse signal, a pulse generator for generating the trigger pulse signal after the elapse of a delay time from the reference signal, and a delay time control unit for controlling the delay time. The delay time control unit includes a multi-phase clock generator for generating a plurality of clock signals of different phases from each other, a clock selector for selecting one or more of the clock signals, and a pulse generation start circuit for supplying a signal to start the generation of the trigger pulse signal by the pulse generator in accordance with a count derived by counting one of the clock signals selected by the clock selector.

In accordance with the present apparatus, the delay time before the generation of the trigger pulse signal is a sum of a first time corresponding to a phase shift of the one of the clock pulses selected by the clock selector and a second time required to count up the one of the clock pulses selected by the clock selector to a predetermined count. Accordingly, even if a delay line is used as the multi-phase clock generator, the maximum delay time of the delay line is shorter than one period of the clock signal and the delay time of the delay line is much smaller than that in the prior art apparatus. Accordingly, in accordance with the present apparatus, the precision of the delay line may be enhanced without increasing the cost and hence the precision of the delay time of the trigger pulse may be enhanced without the increase of cost.

The delay time control unit may further include a pulse generation stop circuit which produces a signal to stop the oscillation of the trigger pulse by the pulse generator in accordance with a count derived by counting one of the clock signals selected by the clock selector.

The pulse generator may further include a control circuit for controlling at least one of frequencies, duty factors and the numbers of pulses of the trigger pulses in accordance with a count derived by counting one of the clock signals selected by the clock selector. In this case, since at least one of the frequencies, duty factors and the numbers of pulses of the trigger pulse signals are controlled in accordance with the count of one of the clock signals, a circuit corresponding to the pulse oscillation circuit 33 in the prior art apparatus is not necessary. Accordingly, the apparatus is reduced in size and the precision is enhanced.

Where the delay time control unit includes the pulse generation stop circuit, the clock selector may select two of the clock signals, the pulse generator may include a control circuit which controls the frequencies and the duty factors of the trigger pulse signals in accordance with a count derived by counting the one of the two clock signals selected by the clock selector, and the pulse generation stop circuit may include a circuit for producing the signal to stop the generation of the trigger pulse signals by the pulse generator in accordance with a count derived by counting the other of the two clock signals selected by the clock selector.

Where the delay time control unit includes the pulse generation start circuit, the pulse generator may include a control circuit for logically operating the signal to start the generation of the trigger pulse signal supplied to the pulse generation start circuit and the signal to stop the generation of the trigger pulse signal supplied to the pulse generation stop circuit.

DESCRIPTION OF THE PREFERRED EMBODIMENTS

An apparatus for generating the trigger pulse to be used for generating the ultrasonic wave in accordance with the present invention is now explained with reference to the drawings.

<First Embodiment>

Figure 1:
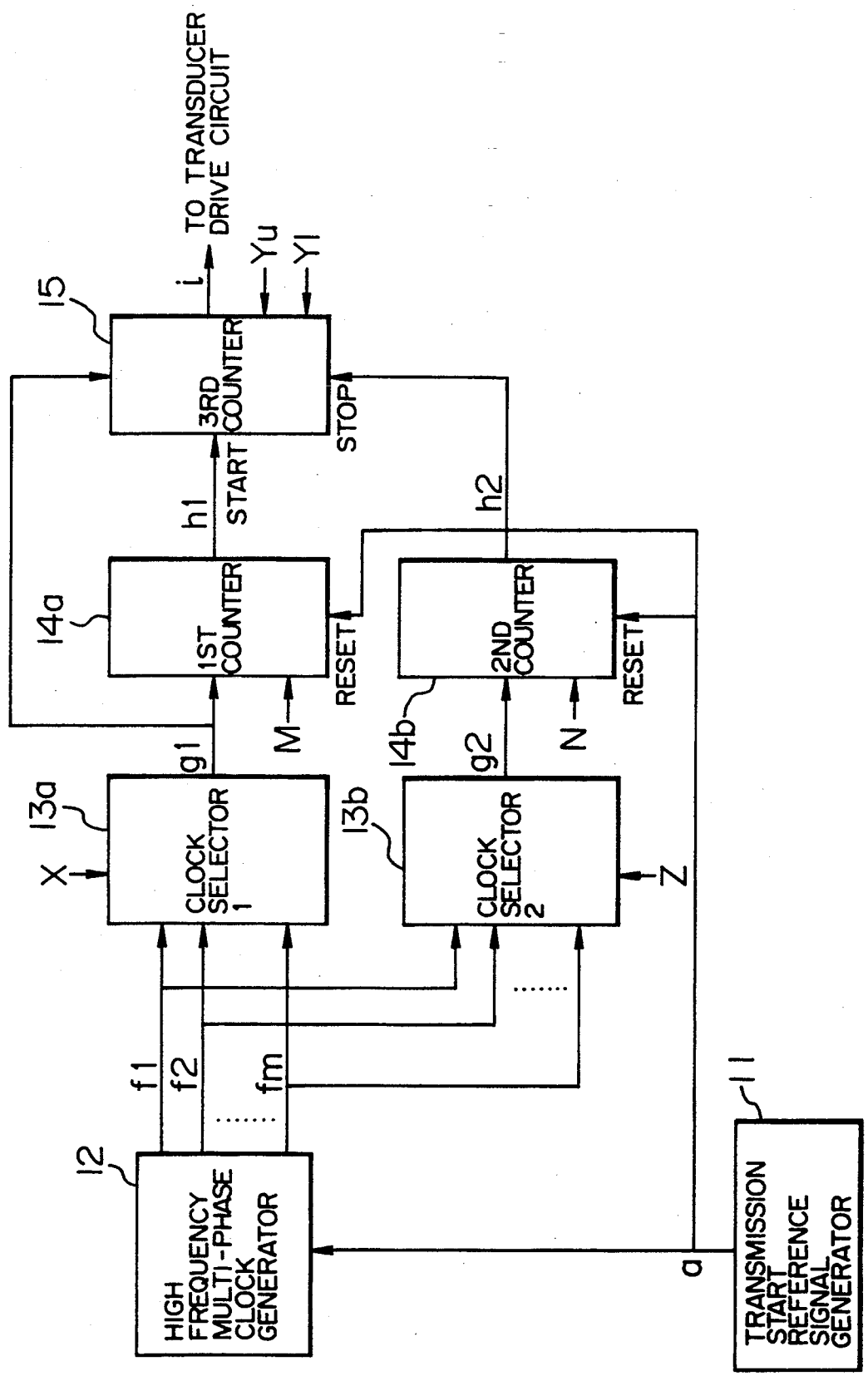
FIG. 1 shows a block diagram of a trigger pulse generator in accordance with a first embodiment of the present invention.

A trigger pulse generator in accordance with a first embodiment comprises, as shown in FIG. 1, a transmission start reference signal generator 11 for generating a reference signal a for the start of transmission, a high frequency multi-phase clock generator 12 for generating a plurality of high frequency clock signals f1, f2, . . . , fm having phases thereof shifted from each other, in synchronism with the reference signal a, a first clock selector 13a for selecting one of the high frequency multi-phase clocks f1, f2, . . . , fm to output it as a signal g1, a second clock selector 13b for selecting another one of the high frequency multi-phase clock signals to output is as a signal g2, a first counter 14a for counting the high frequency clock signal g1 and producing an output signal h1 when the count reaches a predetermined count M, a second counter 14b for counting the high frequency clock signal g2 and switching the output signal h2 from a high level to a low level when the count reaches a predetermined count N (N>M), and a third counter 15 for cyclically counting the high frequency clock g1 during the period from the switching of the signal h1 the high level to the low level to the switching of the signal h2 from the high level to the low level and producing a pulse as a trigger pulse signal i which is switched from the high level to the low level and from the low level to the high level each time the count reaches sequential preset counts Yu and Yi, respectively. In the present embodiment, the third counter 15 forms a pulse generator which generates the trigger pulse signal after the elapse of the delay time from the reference signal. The high frequency multi-phase clock generator 12, the first clock selector 13a, the second clock selector 13b, the first counter 14a and the second counter 14b form the delay time control unit which controls the delay time.

Figure 5:
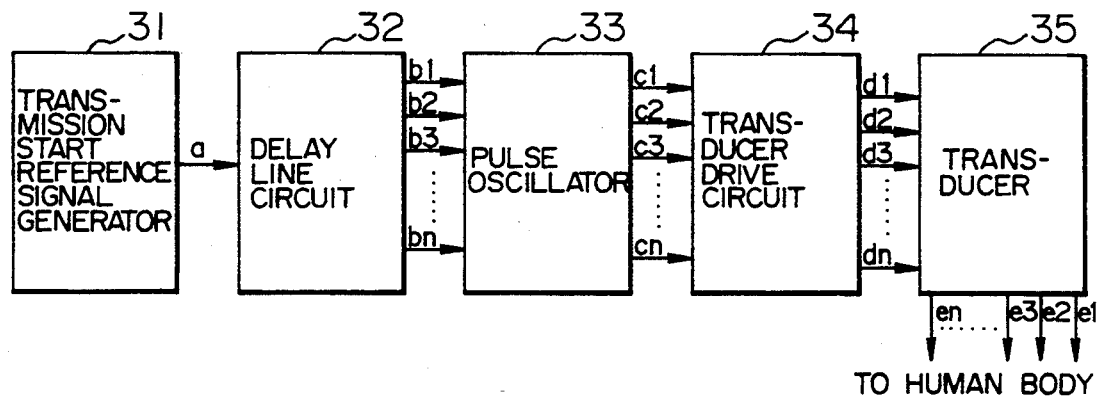
FIG. 5 shows a block diagram of a prior art trigger pulse generator.
Figure 6:
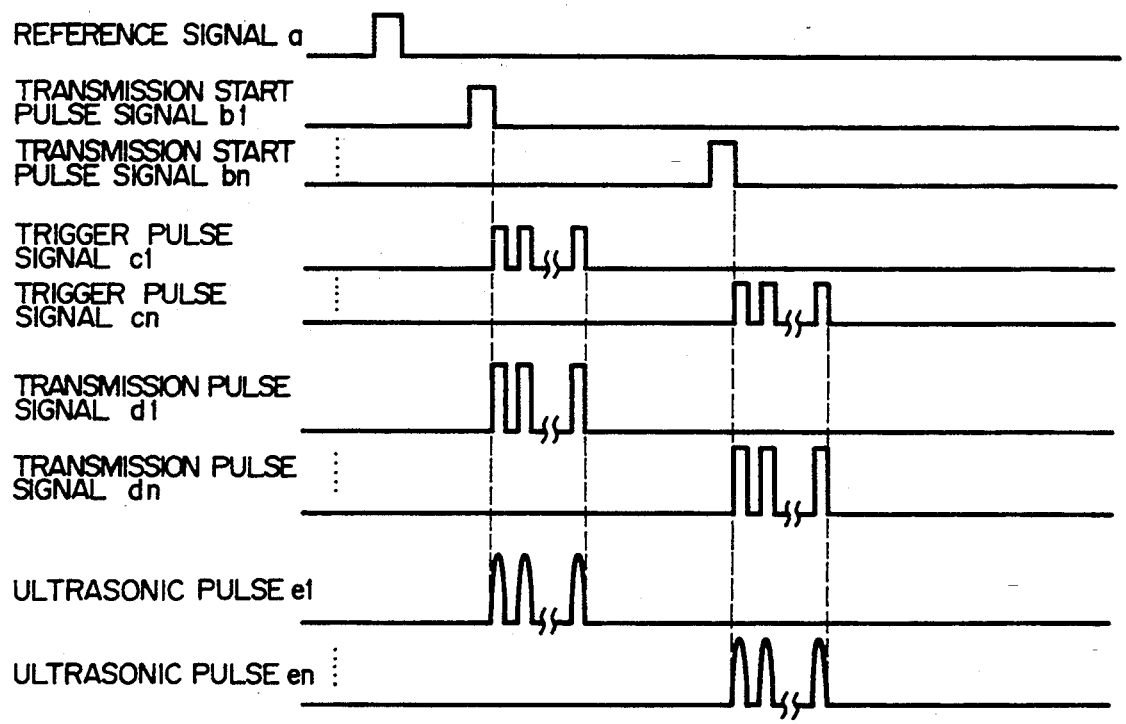
FIG. 6 shows waveforms of signals in the circuit of FIG. 5.

When the pulse generator is used for the ultrasonic diagnosis equipment, the trigger pulse signal i outputted from the third counter 15 is supplied to the transducer drive circuit of the ultrasonic diagnosis equipment, as it is in the prior art apparatus shown in FIG. 5.

While a configuration for one transmission channel is shown in FIG. 1, as many combinations of the clock selectors 13a and 13b, the counters 14a and 14b and the third counter 15 as the number of transmission channels may be provided for a multi-channel configuration.

Figure 2:
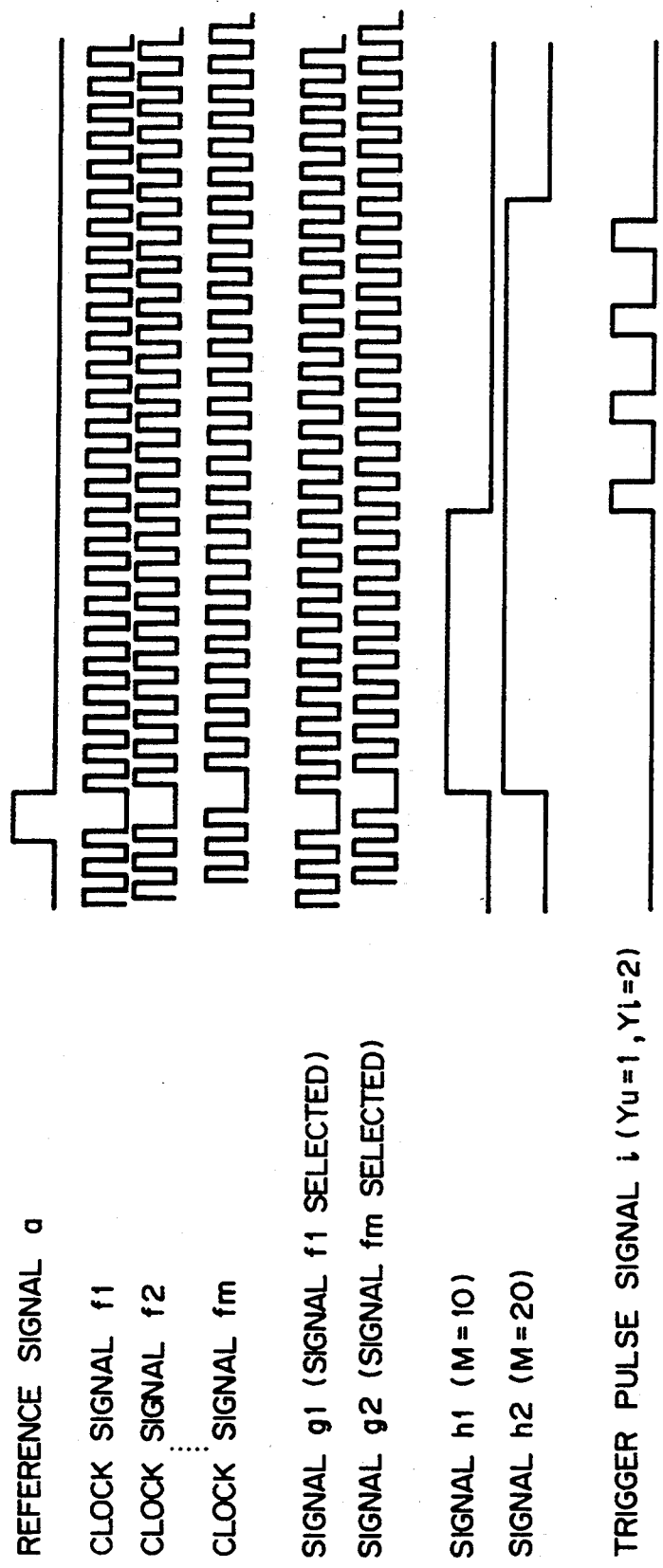
FIG. 2 shows waveforms of signals in the circuit of FIG. 1.

The apparatus shown in FIG. 1 operates as follows. The reference signal a generated by the transmission start reference signal generator 11 is sent to the high frequency multi-phase clock generator 12, the first counter 14a and the second counter 14b. When the high frequency multi-phase clock generator 12 receives it, it outputs the m high frequency clock signals f1, f2, . . . , fm which are synchronous with the reference signal a as shown in FIG. 2. The high frequency clock signals f1, f2, . . . , fm may have the same frequency and phases thereof shifted from each other. A time difference between the two adjacent high frequency clock signals is set to $T_c/m$, where $T_c$ is a period of the high frequency clock signals. The high frequency multi-phase clock generator 12 for this purpose may be constructed by a delay line having a much smaller delay time than that of the delay line of the delay line circuit 32 of the prior art apparatus. The high frequency multi-phase clock generator 12 may be a product TQW-100 marketed by a Japanese corporation Showa Electric Wire & Cable Co., Ltd.

Of the m high frequency clock signals, two clock signals g1 and g2 are selected by the first clock selector 13a and the second clock selector 13b, respectively, and they are sent to the first counter 14a and the second counter 14b, respectively.

The counts M and N are preset in the first counter 14a and the second counter 14b, respectively. The counts M and N may be modified in response to an external control signal. After the first counter 14a and the second counter 14b are reset by the reference signal a, they start to count, and when the counts thereof reach the preset counts M and N, respectively, the counter outputs h1 and h2 are changed from the high level to the low level (or vice versa), respectively.

Assuming that the first clock selector 13a selects the X-th high frequency clock fx of the high frequency multi-phase clock signals and the preset count of the first counter 14a is M, the output h1 of the first counter 14a is changed from the high level to the low level after the elapse of the time $$T_c(X/m+M)$$

from the time when the reference signal a was received (in the present embodiment it is a fall time of the reference signal a although it may be a rise time of the reference signal a). The elapse time corresponds to the delay time of the trigger pulse signal i generated by the third counter.

The third counter 15 receives the output h1 as the count starts command signal and start to count the high frequency clock signal g1 after the output h1 has changed from the high level to the low level, that is after the elapse of the delay time. The count Yu for defining the period to maintain the output i at the high level and the count Yi for defining the period to maintain the output i at the low level are preset in the third counter 15 (the counts Yu and Yi may be modified in response to an external control signal) so that the third counter 15 maintains the output i at the high level until it counts the high frequency clock signal g1 to Yu. Immediately after the count reaches Yu, the output i is changed to the low level and the output Yi is maintained at the low level until the count reaches Yi. Then, the output i is again changed to the high level. The third counter 15 repeats the above operation to output the trigger pulse signals i and stops the counting when the output h2 sent from the second counter 14b changes from the high level to the low level.

The period of the trigger pulse signals i produced by the third counter 15 is Tc(Yu+Yi) and a reciprocal thereof is its frequency. Thus, since the time difference (delay) between adjacent high frequency clocks signals is based on Tc/m, the delay time is set independently of the ultrasonic frequency. A duty factor of the trigger pulse signal is Yu/(Yu+Yi). A length of a pulse train of the trigger pulse signals is determined by the preset count N of the second counter 14b and the high frequency multi-phase clock signal fz (Z-th high frequency clock signal) selected by the second clock selector 13b and it is given by $$Tc\{(X-Z)/m+(M-N)\}$$

Where the preset count Yu for the third counter 15 is set to the maximum count of the third counter 15, the preset count Yi is set to 0 and the third counter 15 is configured to be reset by the output h2 of the second counter 14b, the third counter 15 outputs the trigger pulse signal i having only one pulse. The width of one pulse of the trigger pulse signal i is given by $$Tc\{(X-Z)/m+(M-N)\}$$

In the trigger pulse generator of the first embodiment, the trigger pulse signal having any number of pulses from one to a multiple may be generated in various states. Since the delay time of the pulse is Tc(X/m+M), the length of the delay may be controlled by changing the clock period Tc of the high frequency multi-phase clock signal generated by the high frequency multi-phase clock generator 12, the number m of phases thereof, the selection number X of the first clock selector 13a and/or the preset count M of the first counter 14a. Since the delay time has a minimum unit of Tc/m which is small, the delay time may be set precisely. By increasing the frequency of the high frequency multi-phase clock signal, the unit may be further reduced.

The frequency and the duty factor of the trigger pulse signal may be controlled by changing the preset count Yu or Ti of the third counter 15.

The length of the pulse train which determines the number of pulses contained in the trigger pulse signal may be controlled by changing the selection value Z of the second clock selector 13b and the preset count N of the second counter 14b.

The high frequency clock signal to be sent to the second counter 14b may be the high frequency clock g1 selected by the first clock selector 13a. In order to output the last pulse of the pulse train in a complete form, it is desirable to stop the generation of the pulse by the clock signal g2 which is phase-delayed from the clock signal g1.

<Second Embodiment>

Figure 3:
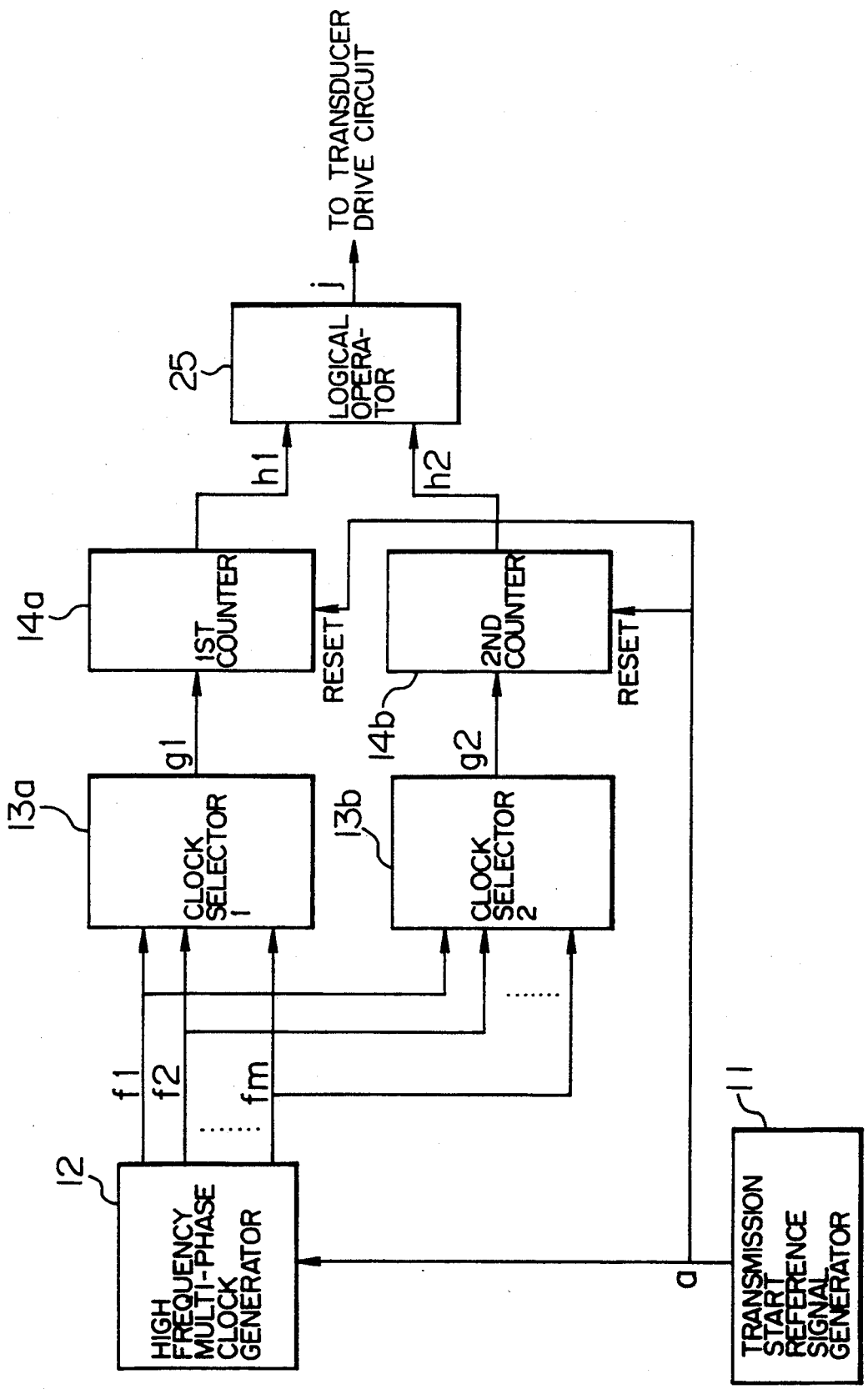
FIG. 3 shows a block diagram of a trigger pulse generator in accordance with another embodiment of the present invention.

As shown in FIG. 3, a trigger pulse generator in accordance with a second embodiment is provided with a logic operation circuit 25 which receives the output h1 of the first counter 14a and the output h2 of the second counter 14b. The logical operation circuit 25 is a substitution of the third counter 15 in the trigger pulse generator of the first embodiment (FIG. 1). The remaining configuration is identical to that of the trigger pulse generator of the first embodiment.

Figure 4:
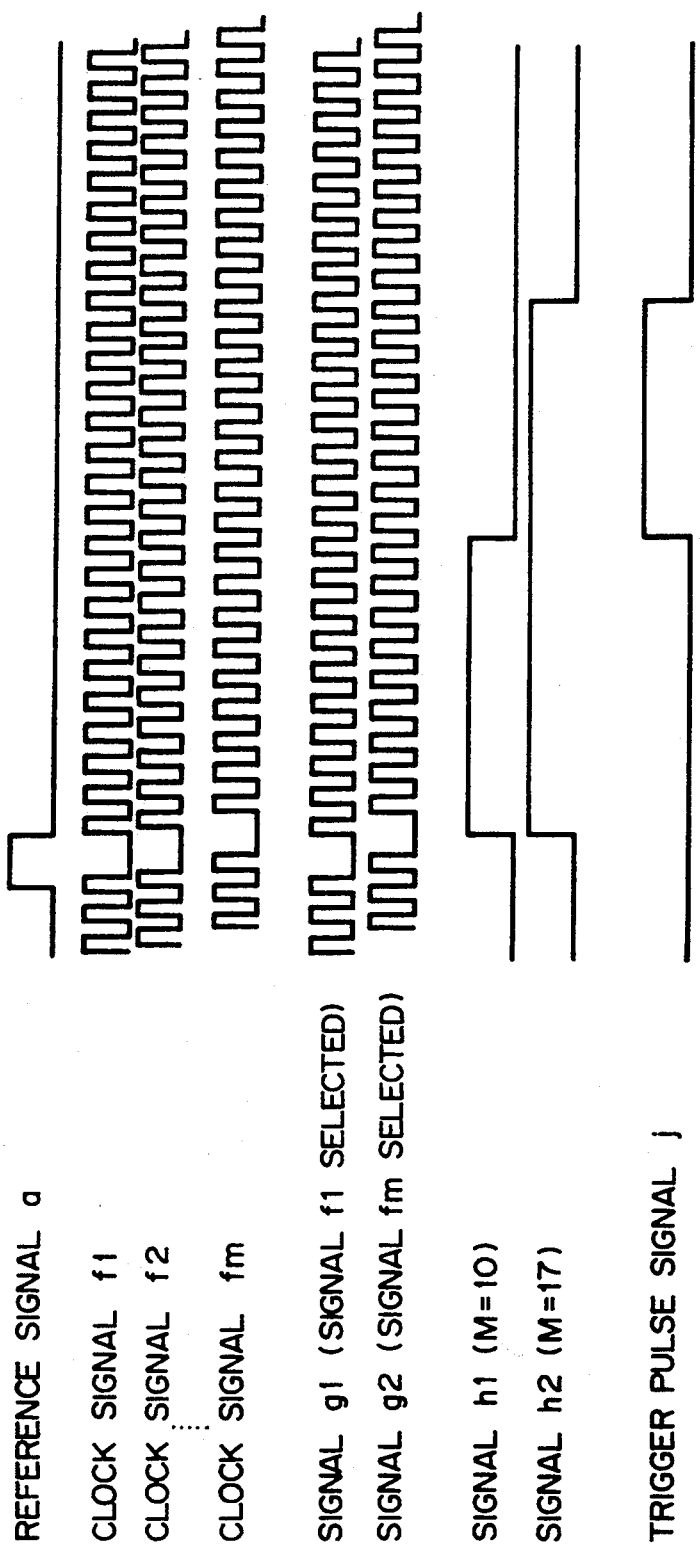
FIG. 4 shows waveforms of signals in the circuit of FIG. 3.

As shown in FIG. 4, the logical operation circuit 25 performs an logical operation (for example, exclusive OR function) to the outputs h1 and h2 of the first and second counters 14a and 14b. It outputs a trigger pulse signal having one pulse which is at the high level only when the levels of the outputs h1 and h2 differ.

The delay time of the trigger pulse signal is same as that in the first embodiment. The pulse width of the one pulse contained in the trigger pulse signal is given by $$Tc\{(X-Z)/m+(M-N)\}$$

Where the logical operation circuit 25 is used, it is not necessary to set the preset counts Yu and Ti as opposed to the third counter 15 in the first embodiment. However, the trigger pulse signal generated contains only one pulse.

The trigger pulse generators shown in the first and second embodiments may generate high precision and stable trigger pulses because they do not use the large delay time delay line and analog passive components such as resistors and capacitors which raise the problems of instability of constants with surrounding temperature and the scatter of constants but fully comprise digital components.

Since the digital circuit components may be implemented by a gate array, the size of the apparatus is reduced and the cost is reduced.

The present trigger pulse generator may be used to generate the trigger pulse in various equipments including ultrasonic diagnosis equipment and the ultrasonic doppler blood flow measurement equipment.

As is apparent from the above description, the trigger pulse generator of the present invention has a high precision and stable characteristic because it primarily comprises the digital circuit components.

Further, since the minimum unit to adjust the delay time of the pulse generation is small, the delay time can be precisely set.

Further, since the pulse width of the pulse generated, the rise and fall times thereof and the pulse stop time are controlled by the counts of the clocks, the risk of change of the generated pulse by the change of environment is eliminated.

In addition, by implementing the digital circuit by the gate array, a apparatus is reduced in size and the manufacturing cost may be reduced.

What is claimed is:

1. An apparatus for generating a trigger pulse signal, to be used for transmitting an ultrasonic wave, said apparatus comprising:

reference signal generation means for generating a reference signal as a reference to the generation of the trigger pulse signal;

pulse generation means for generating the trigger pulse signal after the elapse of a delay time from the reference signal; and delay time control means for controlling the delay time;

said delay time control means including multi-phase clock generation means for generating a plurality of clock signals of different phases from each other, clock selection means for selecting one or more of the clock signals, and pulse generation start means for supplying a signal to start the generation of the trigger pulse signal by said pulse generation means in accordance with a count derived by counting one of the clock signals selected by said clock selection means, wherein said delay time control means further includes pulse generation stop means for producing a signal to stop the oscillation of the trigger pulse signal by said pulse generation means in accordance with a count derived by counting one of the clock signals selected by said clock selection means.

2. An apparatus for generating a trigger pulse signal according to claim 1 wherein said pulse generation means further includes means for controlling at least one of a frequency, a duty factor and the number of pulses of the trigger pulse signal in accordance with a count derived by counting one of the clock signals selected by said clock selection means.

3. An apparatus for generating a trigger pulse signal according to claim 2, wherein said multi-phase clock generation means comprises a delay line circuit.

4. An apparatus for generating a trigger pulse signal according to claim 2, wherein said delay time control means comprises means for controlling the delay time independently from a desired ultrasonic frequency.

5. An apparatus for generating a trigger pulse signal according to claim 1 wherein said clock selection means selects two of the clock signals, said pulse generation means includes means for controlling a frequency and a duty factor of the trigger pulse signal in accordance with a count derived by counting one of the two clock signals selected by said clock selection means, and said pulse generation stop means includes means for producing the signal to stop the generation of the trigger pulse signal by said pulse generation means in accordance with a count derived by counting the other of the two clock signals selected by said clock selection means.

6. An apparatus for generating a trigger pulse signal according to claim 5, wherein said multi-phase clock generation means comprises a delay line circuit.

7. An apparatus for generating a trigger pulse signal according to claim 5, wherein said delay time control means comprises means for controlling the delay time independently from a desired ultrasonic frequency.

8. An apparatus for generating a trigger pulse signal according to claim 1 wherein said pulse generation means includes means for logically operating the signal to start the generation of the trigger pulse signal supplied to said pulse generation start means and the signal to stop the generation of the trigger pulse signal supplied to said pulse generation stop means.

9. An apparatus for generating a trigger pulse signal according to claim 8, wherein said logically operating means comprises an exclusive OR gate.

10. An apparatus for generating a trigger pulse signal according to claim 9, wherein said multi-phase clock generation means comprises a delay line circuit.

11. An apparatus for generating a trigger pulse signal according to claim 8, wherein said multi-phase clock generation means comprises a delay line circuit.

12. An apparatus for generating a trigger pulse signal according to claim 8, wherein said delay time control means comprises means for controlling the delay time independently from a desired ultrasonic frequency.

13. An apparatus for generating a trigger pulse signal according to claim 1, wherein said multi-phase clock generation means comprises a delay line circuit.

14. An apparatus for generating a trigger pulse signal according to claim 1, wherein said delay time control means comprises means for controlling the delay time independently from a desired ultrasonic frequency.

15. An apparatus for generating a trigger pulse signal, to be used for transmitting an ultrasonic wave, said apparatus comprising:

reference signal generation means for generating a reference signal as a reference to the generation of the trigger pulse signal;

pulse generation means for generating the trigger pulse signal after the elapse of a delay time from the reference signal; and delay time control means for controlling the delay time;

said delay time control means including multi-phase clock generation means for generating a plurality of clock signals of different phases from each other, clock selection means for selecting one or more of the clock signals, and pulse generation start means for supplying a signal to start the generation of the trigger pulse signal by said pulse generation means in accordance with a count derived by counting one of the clock signals selected by said clock selection means, wherein said pulse generation means further includes means for controlling at least one of a frequency, a duty factor and the number of pulses of the trigger pulse signal in accordance with a count derived by counting one of the clock signals selected by said clock selection means.

16. An apparatus for generating a trigger pulse signal according to claim 15, wherein said multi-phase clock generation means comprises a delay line circuit.

17. An apparatus for generating a trigger pulse signal according to claim 15, wherein said delay time control means comprises means for controlling the delay time independently from a desired ultrasonic frequency.

* * * * *